United States Patent
Hasebe et al.

(10) Patent No.: US 7,923,378 B2
(45) Date of Patent: Apr. 12, 2011

(54) FILM FORMATION METHOD AND APPARATUS FOR FORMING SILICON-CONTAINING INSULATING FILM

(75) Inventors: Kazuhide Hasebe, Nirasaki (JP); Shigeru Nakajima, Nirasaki (JP); Jun Ogawa, Nirasaki (JP)

(73) Assignee: Tokyo Electron Limited, Tokyo (JP)

( * ) Notice: Subject to any disclaimer, the term of this patent is extended or adjusted under 35 U.S.C. 154(b) by 185 days.

(21) Appl. No.: 12/320,535

(22) Filed: Jan. 28, 2009

(65) Prior Publication Data
US 2009/0203227 A1    Aug. 13, 2009

(30) Foreign Application Priority Data

Feb. 1, 2008 (JP) ................. 2008-022279
Jan. 8, 2009 (JP) ................. 2009-002550

(51) Int. Cl.
*H01L 21/00* (2006.01)

(52) U.S. Cl. ........ 438/763; 438/786; 438/791; 438/793; 257/E21.192; 257/E21.267; 257/E21.279; 257/E21.482; 257/E21.497

(58) Field of Classification Search .......... 438/709–711, 438/763–786, 791–793; 257/E21.192, 267–293, 257/482–497, 584

See application file for complete search history.

(56) References Cited

U.S. PATENT DOCUMENTS

| | | | | |
|---|---|---|---|---|
| 4,872,938 | A * | 10/1989 | Davis et al. | 156/345.54 |
| 4,904,621 | A * | 2/1990 | Loewenstein et al. | 134/1.2 |
| 5,248,636 | A * | 9/1993 | Davis et al. | 438/709 |
| 5,812,403 | A * | 9/1998 | Fong et al. | 700/121 |
| 5,935,334 | A * | 8/1999 | Fong et al. | 118/723 ME |
| 6,774,040 | B2 * | 8/2004 | Comita et al. | 438/689 |
| 7,297,641 | B2 * | 11/2007 | Todd et al. | 438/763 |
| 7,510,984 | B2 * | 3/2009 | Saito et al. | 438/791 |
| 7,704,867 | B2 * | 4/2010 | Kim et al. | 438/594 |
| 2008/0145535 | A1 * | 6/2008 | Lei et al. | 427/255.18 |
| 2008/0207007 | A1 * | 8/2008 | Thridandam et al. | 438/778 |
| 2010/0189927 | A1 * | 7/2010 | Sato et al. | 427/579 |
| 2010/0190348 | A1 * | 7/2010 | Akae et al. | 438/703 |

FOREIGN PATENT DOCUMENTS

JP    2004-281853    10/2004

* cited by examiner

*Primary Examiner* — Michael S Lebentritt
(74) *Attorney, Agent, or Firm* — Smith, Gambrell & Russell, LLP

(57) ABSTRACT

A silicon-containing insulating film is formed on a target substrate by CVD, in a process field to be selectively supplied with a first process gas including di-iso-propylaminosilane gas and a second process gas including an oxidizing gas or nitriding gas. The film is formed by performing a plurality of times a cycle alternately including first and second steps. The first step performs supply of the first process gas, thereby forming an adsorption layer containing silicon on a surface of the target substrate. The second performs supply of the second process gas, thereby oxidizing or nitriding the adsorption layer on the surface of the target substrate. The second step includes an excitation period of supplying the second process gas to the process field while exciting the second process gas by an exciting mechanism.

18 Claims, 6 Drawing Sheets

FILM FORMATION METHOD AND APPARATUS FOR FORMING SILICON-CONTAINING INSULATING FILM

BACKGROUND OF THE INVENTION

1. Field of the Invention

The present invention relates to a film formation method and apparatus for forming a silicon-containing insulating film on a target substrate, such as a semiconductor wafer, in a semiconductor process. The term "semiconductor process" used herein includes various kinds of processes which are performed to manufacture a semiconductor device or a structure having wiring layers, electrodes, and the like to be connected to a semiconductor device, on a target substrate, such as a semiconductor wafer or a glass substrate used for an FPD (Flat Panel Display), e.g., an LCD (Liquid Crystal Display), by forming semiconductor layers, insulating layers, and conductive layers in predetermined patterns on the target substrate.

2. Description of the Related Art

In recent years, owing to the demands of increased miniaturization and integration of semiconductor integrated circuits, it is required to alleviate the thermal history of semiconductor devices in manufacturing steps, thereby improving the characteristics of the devices. For vertical processing apparatuses, it is also required to improve semiconductor processing methods in accordance with the demands described above. For example, there is a CVD process which performs film formation while intermittently supplying a source gas and so forth to repeatedly form layers each having an atomic or molecular level thickness, one by one, or several by several. In general, this film formation method is called ALD (Atomic Layer Deposition) or MLD (Molecular Layer Deposition), which allows a predetermined process to be performed without exposing wafers to a very high temperature. Further, the ALD or MLD film formation provides good step coverage, and thus is suitable for filling recess portions of semiconductor devices, such as inter-gate gaps, which have become narrower with increased miniaturization of the devices. For example, Jpn. Pat. Appln. KOKAI Publication No. 2004-281853 (Patent Document 1) discloses a method for forming a silicon nitride film by ALD at a low temperature of 300 to 600° C.

BRIEF SUMMARY OF THE INVENTION

An object of the present invention is to provide a film formation method and apparatus for a semiconductor process, which can form a silicon-containing insulating film of high quality at a low temperature.

According to a first aspect of the present invention, there is provided a film formation method for a semiconductor process for forming a silicon-containing insulating film on a target substrate by CVD, in a process field configured to be selectively supplied with a first process gas comprising di-iso-propylaminosilane gas and a second process gas comprising an oxidizing gas or nitriding gas, the method being arranged to perform a cycle a plurality of times to laminate thin films formed by respective times, thereby forming the silicon-containing insulating film with a predetermined thickness, the cycle alternately comprising: a first step of performing supply of the first process gas to the process field while maintaining a shut-off state of supply of the second process gas to the process field, thereby forming an adsorption layer containing silicon on a surface of the target substrate; and a second step of performing supply of the second process gas to the process field while maintaining a shut-off state of supply of the first process gas to the process field, thereby oxidizing or nitriding the adsorption layer on the surface of the target substrate, the second step comprising an excitation period of supplying the second process gas to the process field while exciting the second process gas by an exciting mechanism.

According to a second aspect of the present invention, there is provided a film formation apparatus for a semiconductor process for forming a silicon-containing insulating film, the apparatus comprising: a reaction chamber having a process field configured to accommodate a target substrate; a support member configured to support the target substrate inside the process field; a heater configured to heat the target substrate inside the process field; an exhaust system configured to exhaust gas from the process field; a first process gas supply circuit configured to supply a first process gas comprising di-iso-propylaminosilane gas to the process field; a second process gas supply circuit configured to supply a second process gas comprising an oxidizing gas or nitriding gas to the process field; an exciting mechanism configured to excite the second process gas to be supplied to the process field; and a control section configured to control an operation of the apparatus, wherein, in order to form a silicon-containing insulating film on the target substrate by CVD, the control section is preset to perform a cycle a plurality of times to laminate thin films formed by respective times, thereby forming the silicon-containing insulating film with a predetermined thickness, the cycle alternately comprising a first step of performing supply of the first process gas to the process field while maintaining a shut-off state of supply of the second process gas to the process field, thereby forming an adsorption layer containing silicon on a surface of the target substrate, and a second step of performing supply of the second process gas to the process field while maintaining a shut-off state of supply of the first process gas to the process field, thereby oxidizing or nitriding the adsorption layer on the surface of the target substrate, the second step comprising an excitation period of supplying the second process gas to the process field while exciting the second process gas by the exciting mechanism.

According to a third aspect of the present invention, there is provided a computer readable medium containing program instructions for execution on a processor, which is used for a film formation apparatus for a semiconductor process for forming a silicon-containing insulating film on a target substrate by CVD, in a process field configured to be selectively supplied with a first process gas comprising di-iso-propylaminosilane gas and a second process gas comprising an oxidizing gas or nitriding gas, wherein the program instructions, when executed by the processor, control the film formation apparatus to perform a cycle a plurality of times to laminate thin films formed by respective times, thereby forming the silicon-containing insulating film with a predetermined thickness, the cycle alternately comprising: a first step of performing supply of the first process gas to the process field while maintaining a shut-off state of supply of the second process gas to the process field, thereby forming an adsorption layer containing silicon on a surface of the target substrate; and a second step of performing supply of the second process gas to the process field while maintaining a shut-off state of supply of the first process gas to the process field, thereby oxidizing or nitriding the adsorption layer on the surface of the target substrate, the second step comprising an excitation period of supplying the second process gas to the process field while exciting the second process gas by an exciting mechanism.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinafter.

BRIEF DESCRIPTION OF THE SEVERAL VIEWS OF THE DRAWING

The accompanying drawings, which are incorporated in and constitute a part of the specification, illustrate embodiments of the invention, and together with the general description given above and the detailed description of the embodiments given below, serve to explain the principles of the invention.

DETAILED DESCRIPTION OF THE INVENTION

Figure 1:
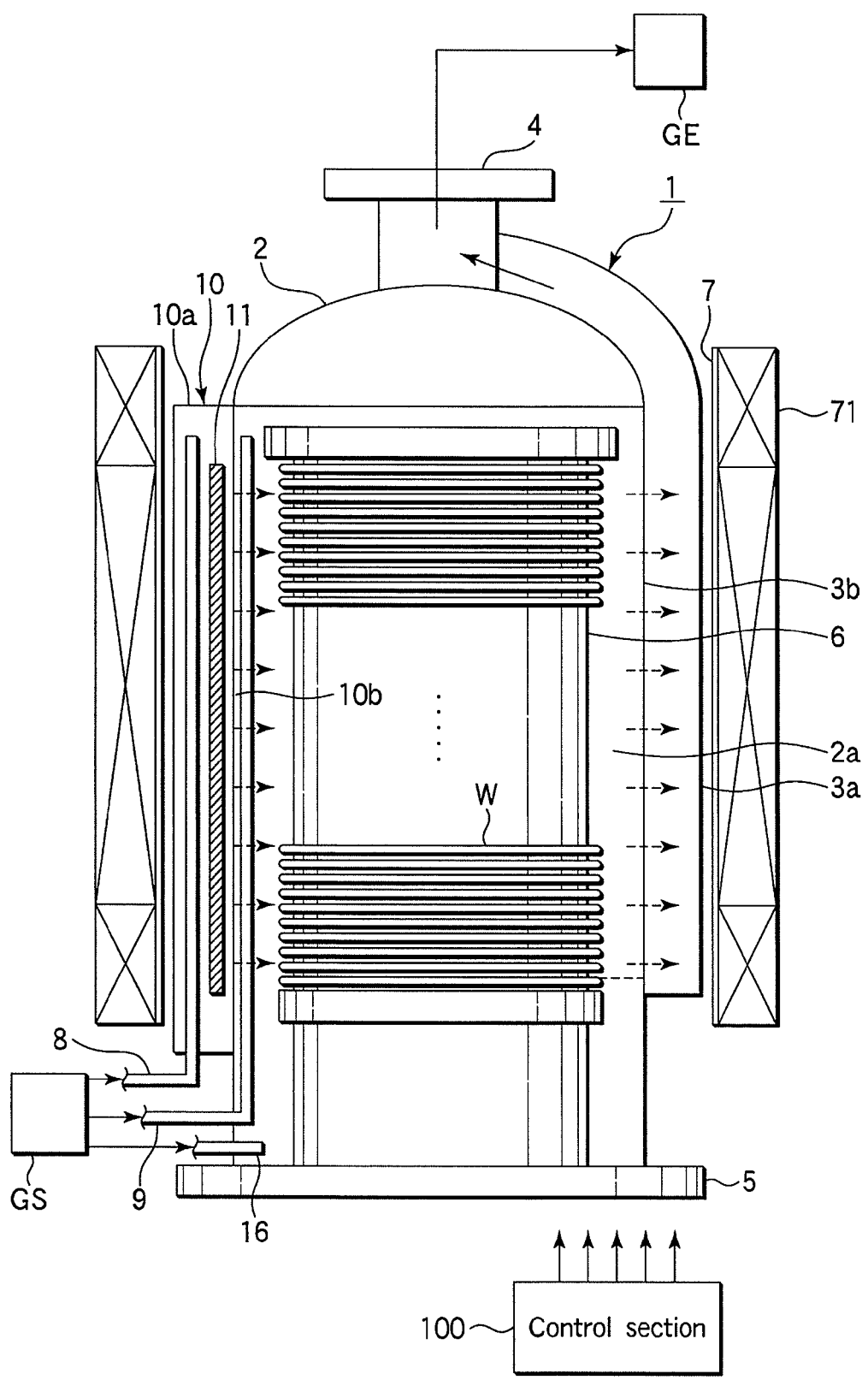
FIG. 1 is a sectional view showing a film formation apparatus (vertical plasma CVD apparatus) according to an embodiment of the present invention.

In the process of developing the present invention, the inventors studied problems with regard to conventional methods for forming a silicon oxide film by CVD in a semiconductor process. As a result, the inventors have arrived at the findings given below.

In the case of conventional methods for forming a silicon oxide film, the film formation rate is decreased and/or the film quality of a silicon oxide film is deteriorated with a decrease in the process temperature, in general. The film formation rate is an important factor that determines the process throughput, and the film quality of silicon oxide films is increasingly becoming a sensitive issue, along with miniaturization of devices that requires thinner films. For example, where a gate oxide film is formed of a thin silicon oxide film, a leakage current may be increased if the film quality is not good. Under the circumstances, where a silicon source gas of this kind is used, even if an ALD or MLD method is employed, the process temperature needs to be set at 300° C. or more, as disclosed in Patent Document 1 described above.

However, the temperature used for forming silicon oxide films is required to be further lowered. In addition, the quality of formed silicon oxide films is required to be further improved. Consequently, it is necessary to develop a method for forming a silicon oxide film of higher quality at a lower temperature.

In this respect, as a result of studies made by the present inventors, it has been found that, where di-iso-propylaminosilane (DIPAS) gas, which is a univalent aminosilane gas, is used as a silicon source gas along with an ALD or MLD method, a silicon oxide film of high quality can be formed with a predetermined film formation rate being maintained even if the process temperature is set at a far lower value than the conventional temperature. In this case, it is possible to further alleviate the thermal history of semiconductor devices in manufacturing steps, thereby improving some of the characteristics of the devices.

An embodiment of the present invention achieved on the basis of the findings given above will now be described with reference to the accompanying drawings. In the following description, the constituent elements having substantially the same function and arrangement are denoted by the same reference numerals, and a repetitive description will be made only when necessary.

Figure 2:
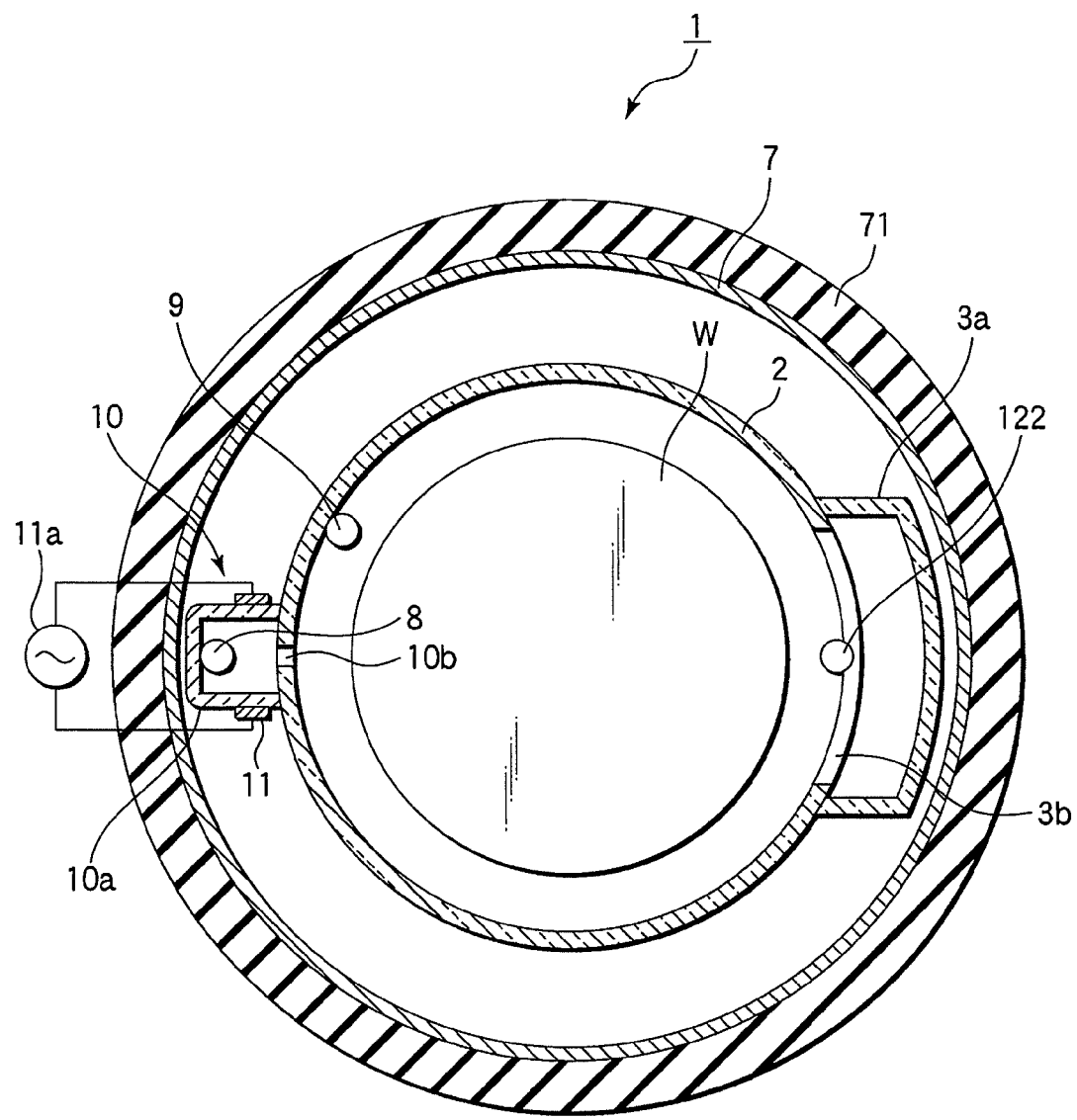
FIG. 2 is a sectional plan view showing part of the apparatus shown in FIG. 1.

FIG. 1 is a sectional view showing a film formation apparatus (vertical plasma CVD apparatus) according to an embodiment of the present invention. FIG. 2 is a sectional plan view showing part of the apparatus shown in FIG. 1. The film formation apparatus 1 has a process field configured to be selectively supplied with a first process gas comprising DIPAS gas as a silicon source gas, and a second process gas comprising oxygen ($O_2$) gas as an oxidizing gas. The film formation apparatus 1 is configured to form a silicon oxide film on target substrates by ALD or MLD in the process field.

As shown in FIG. 1, the film formation apparatus 1 includes an essentially cylindrical reaction tube (reaction chamber) 2 arranged such that its top is closed and the longitudinal direction is set in the vertical direction. The reaction tube 2 is made of a heat-resistant and corrosion-resistant material, such as quartz. In the reaction tube 2, a process field 2a is defined to accommodate and process a plurality of semiconductor wafers (target substrates) stacked at intervals in the vertical direction.

On one side of the reaction tube 2, a long narrow exhaust port 3b for vacuum-exhausting the inner atmosphere is formed by cutting the sidewall of the reaction tube 2 in, e.g., the vertical direction. The exhaust port 3b is covered with an exhaust cover member 3a, which is made of quartz with a U-shape cross-section and attached by welding. The exhaust cover member 3a extends upward along the sidewall of the reaction tube 2, and has a gas outlet 4 at the top of the reaction tube 2. The gas outlet 4 is connected to an exhaust section GE through an airtight exhaust line. The exhaust section GE has a pressure adjusting mechanism including, e.g., a valve and a vacuum exhaust pump (not shown in FIG. 1, but shown in FIG. 3 with a reference symbol 127). The exhaust section GE is used to exhaust the atmosphere within the reaction tube 2, and set it at a predetermined pressure (vacuum level).

A lid 5 is disposed below the reaction tube 2. The lid 5 is made of a heat-resistant and corrosion-resistant material, such as quartz. The lid 5 is moved up and down by a boat elevator described later (not shown in FIG. 1, but shown in FIG. 3 with a reference symbol 128). When the lid 5 is moved up by the boat elevator, the bottom of the reaction tube 2 (load port) is closed. When the lid 5 is moved down by the boat elevator, the bottom of the reaction tube 2 (load port) is opened.

A wafer boat 6 made of, e.g., quartz is placed on the lid 5. The wafer boat 6 is configured to hold a plurality of semiconductor wafers W at predetermined intervals in the vertical direction. A thermally insulating cylinder may be disposed on the lid 5 to prevent the temperature inside the reaction tube 2 from being lowered due to the load port of the reaction tube 2. Further, a rotary table may be disposed to rotatably mount thereon the wafer boat 6 that holds the wafers W. In this case, the temperature of the wafers W placed on the wafer boat 6 can be more uniform.

The reaction tube 2 is surrounded by a temperature adjusting mechanism, such as a thermally insulating cover 71 and a heater 7, which is made of, e.g., a resistive heating body and disposed on the inner surface of the cover 71. The process field 2a inside the reaction tube 2 is heated by the heater 7, so that the wafers W are heated up (increase in temperature) to a predetermined temperature.

Gas distribution nozzles 8 and 9 and a gas nozzle 16 penetrate the sidewall of the reaction tube 2 near the bottom, and are used for supplying process gases (such as an oxidizing gas, a silicon source gas, and an inactive gas for dilution, purge, or pressure control) into the reaction tube 2. Each of the gas distribution nozzles 8 and 9 and gas nozzle 16 is connected to a process gas supply section GS through a mass-flow controller (MFC) and so forth (not shown). The process gas supply section GS includes gas sources of the reactive gases and a gas source of nitrogen ($N_2$) gas used as an inactive gas, so as to prepare a first process gas comprising a silicon source gas and a second process gas comprising an oxidizing gas, as described below.

Specifically, in this embodiment, in order to form a silicon oxide film (product film) on the wafers W by ALD or MLD, di-iso-propylaminosilane (DIPAS) gas is used as a silicon source gas in the first process gas and oxygen gas is used as an oxidizing gas in the second process gas. Each of the first and second process gases may be mixed with a suitable amount of carrier gas (dilution gas, such as $N_2$ gas), as needed. However, such a carrier gas will be mentioned only when necessary, hereinafter, for the sake of simplicity of explanation.

The gas distribution nozzle 8 is connected to gas sources Of $O_2$ gas and $N_2$ gas, the gas distribution nozzle 9 is connected to gas sources of DIPAS gas and $N_2$ gas, and the gas nozzle 16 is connected to a gas source of $N_2$ gas. These gas sources are disposed in the process gas supply section GS.

Each of the gas distribution nozzles 8 and 9 is formed of a quartz pipe which penetrates the sidewall of the reaction tube 2 from the outside and then turns and extends upward (see FIG. 1). Each of the gas distribution nozzles 8 and 9 has a plurality of gas spouting holes, each set of holes being formed at predetermined intervals in the longitudinal direction (the vertical direction) over all the wafers W on the wafer boat 6. Each set of the gas spouting holes delivers the corresponding process gas almost uniformly in the horizontal direction, so as to form gas flows parallel with the wafers W on the wafer boat 6. On the other hand, the gas nozzle 16 used only for the inactive gas is formed of a short gas nozzle, which penetrates the sidewall of the reaction tube 2 from the outside.

A plasma generation section 10 is attached to the sidewall of the reaction tube 2 and extends in the vertical direction. The plasma generation section 10 has a vertically long narrow opening 10b formed by cutting a predetermined width of the sidewall of the reaction tube 2, in the vertical direction. The opening 10b is covered with a quartz cover 10a airtightly connected to the outer surface of the reaction tube 2 by welding. The cover 10a has a vertically long narrow shape with a concave cross-section, so that it projects outward from the reaction tube 2.

With this arrangement, the plasma generation section 10 is formed such that it projects outward from the sidewall of the reaction tube 2 and is opened on the other side to the interior of the reaction tube 2. In other words, the inner space of the plasma generation section 10 communicates with the process space within the reaction tube 2. The opening 10b has a vertical length sufficient to cover all the wafers W on the wafer boat 6 in the vertical direction.

A pair of long narrow electrodes 11 are disposed on the opposite outer surfaces of the cover 10a, and face each other while extending in the longitudinal direction (the vertical direction). The electrodes 11 are connected to an RF (Radio Frequency) power supply 11a for plasma generation, through feed lines. An RF voltage of, e.g., 13.56 MHz is applied to the electrodes 11 to form an RF electric field for exciting plasma between the electrodes 11. The frequency of the RF voltage is not limited to 13.56 MHz, and it may be set at another frequency, e.g., 400 kHz.

The gas distribution nozzle 8 of the second process gas is bent outward in the radial direction of the reaction tube 2, at a position lower than the lowermost wafer W on the wafer boat 6. Then, the gas distribution nozzle 8 vertically extends at the deepest position (the farthest position from the center of the reaction tube 2) in the plasma generation section 10. As shown also in FIG. 2, the gas distribution nozzle 8 is separated outward from an area sandwiched between the pair of electrodes 11 (a position where the RF electric field is most intense), i.e., a plasma generation area where the main plasma is actually generated. The second process gas comprising $O_2$ gas is spouted from the gas spouting holes of the gas distribution nozzle 8 toward the plasma generation area. Then, the second process gas is excited (decomposed or activated) in the plasma generation area, and is supplied in this state with radicals containing oxygen atoms ($O*$ and $O_2*$) onto the wafers W on the wafer boat 6 (the symbol [*] denotes that it is a radical).

At a position near and outside the opening 10b of the plasma generation section 10, the gas distribution nozzle 9 of the first process gas is disposed. The gas distribution nozzle 9 extends vertically upward on one side of the outside of the opening 10b (inside the reaction tube 2). The first process gas comprising DIPAS gas is spouted from the gas spouting holes of the gas distribution nozzle 9 toward the center of the reaction tube 2. Accordingly, the first process gas supplied from the gas distribution nozzle 9 is not turned into plasma (or activated) by the plasma generation section 10.

A plurality of temperature sensors 122, such as thermocouples, for measuring the temperature inside the reaction tube 2 and a plurality of pressure gages (not shown in FIG. 1, but shown in FIG. 3 with a reference symbol 123) for measuring the pressure inside the reaction tube 2 are disposed inside the reaction tube 2.

Figure 3:
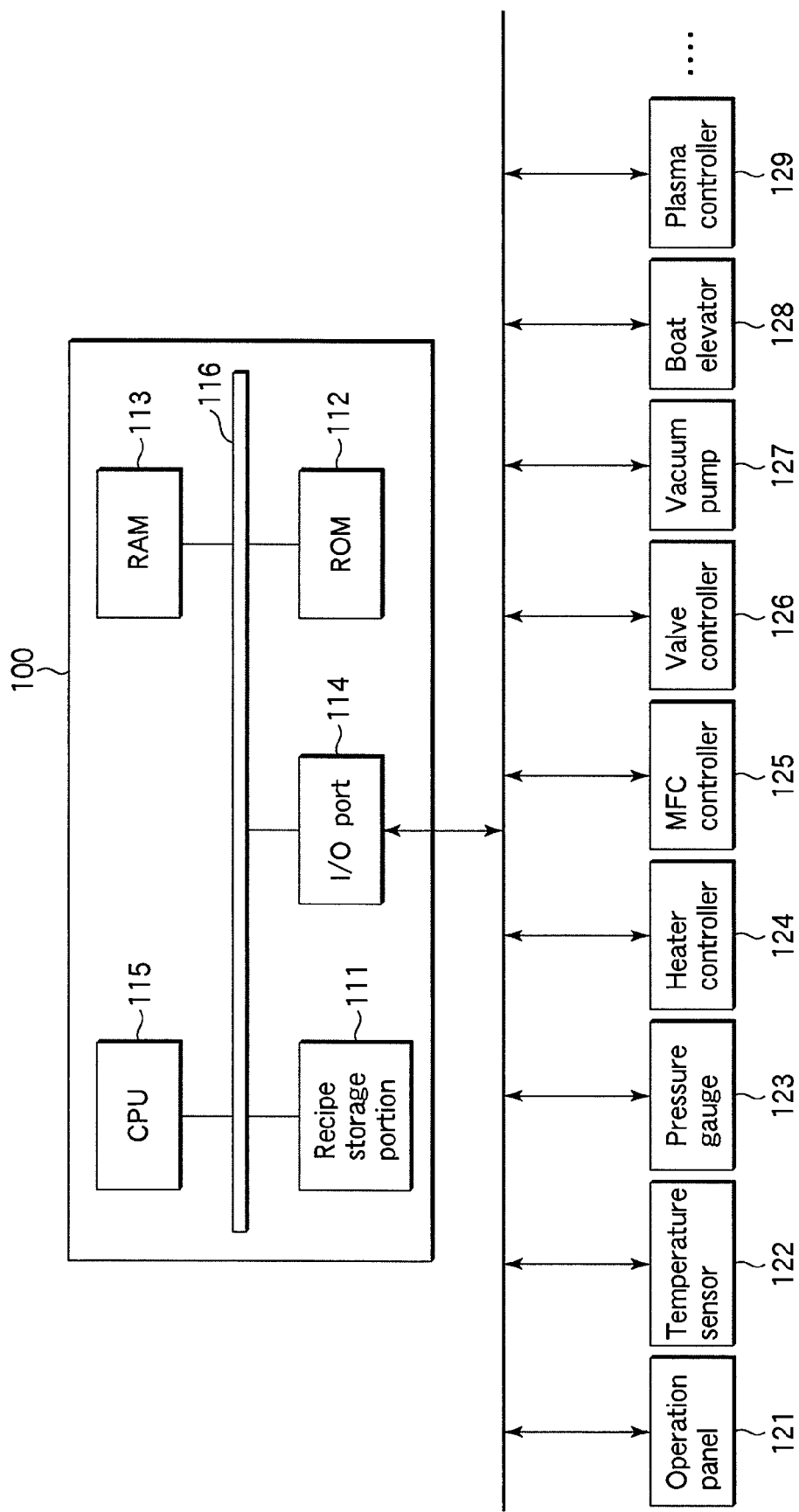
FIG. 3 is a view showing the structure of the control section of the apparatus shown in FIG. 1.

The film formation apparatus 1 further includes a control section 100 for controlling respective portions of the apparatus. FIG. 3 is a view showing the structure of the control section 100. As shown in FIG. 3, the control section 100 is connected to an operation panel 121, (a group of) temperature sensors 122, (a group of) pressure gages 123, a heater controller 124, MFC controllers 125, valve controllers 126, a vacuum pump 127, a boat elevator 128, a plasma controller 129, and so forth.

The operation panel 121 includes a display screen and operation buttons, and is configured to transmit operator's instructions to the control section 100, and show various data transmitted from the control section 100 on the display screen. The (group of) temperature sensors 122 are configured to measure the temperature at respective portions inside the reaction tube 2, exhaust line, and so forth, and to transmit measurement values to the control section 100. The (group of) pressure gages 123 are configured to measure the pressure at respective portions inside the reaction tube 2, exhaust line, and so forth, and to transmit measurement values to the control section 100.

The heater controller 124 is configured to control the heater 7. The heater controller 124 turns on the heater to generate heat in accordance with instructions from the control section 100. Further, the heater controller 124 measures the power consumption of the heater, and transmits it to the control section 100.

The MFC controllers 125 are configured to respectively control the MFCs (not shown) connected to the gas distribution nozzles 8 and 9 and the gas nozzle 16. The MFC controllers 125 control the flow rates of gases flowing through the MFCs in accordance with instructions from the control section 100. Further, the MFC controllers 125 measure the flow rates of gases flowing through the MFCs, and transmit them to the control section 100.

The valve controllers 126 are respectively disposed on piping lines and configured to control the opening rate of valves disposed on piping lines in accordance with instructed values received from the control section 100. The vacuum pump 127 is connected to the exhaust line and configured to exhaust gas from inside the reaction tube 2.

The boat elevator 128 is configured to move up the lid 5, so as to load the wafer boat 6 (wafers W) into the reaction tube 2. The boat elevator 128 is also configured to move the lid 5 down, so as to unload the wafer boat 6 (wafers W) from the reaction tube 2.

The plasma controller 129 is configured to control the plasma generation section 10 in accordance with instructions from the control section 100, so that oxygen gas supplied into the plasma generation section 10 is activated to generate oxygen radicals.

The control section 100 includes a recipe storage portion 111, a ROM 112, a RAM 113, an I/O port 114, and a CPU 115. These members are inter-connected via a bus 116 so that data can be transmitted between them through the bus 116.

The recipe storage portion 111 stores a setup recipe and a plurality of process recipes. After the film formation apparatus 1 is manufactured, only the setup recipe is initially stored. The setup recipe is executed when a thermal model or the like for a specific film formation apparatus is formed. The process recipes are prepared respectively for heat processes to be actually performed by a user. Each process recipe prescribes temperature changes at respective portions, pressure changes inside the reaction tube 2, start/stop timing for supply of process gases, and supply rates of process gases, from the time wafers W are loaded into the reaction tube 2 to the time the processed wafers W are unloaded.

The ROM 112 is a storage medium formed of an EEPROM, flash memory, or hard disc, and is used to store operation programs executed by the CPU 115 or the like. The RAM 113 is used as a work area for the CPU 115.

The I/O port 114 is connected to the operation panel 121, temperature sensors 122, pressure gages 123, heater controller 124, MFC controllers 125, valve controllers 126, vacuum pump 127, boat elevator 128, and plasma controller 129, and is configured to control output/input of data or signals.

The CPU (Central Processing Unit) 115 is the hub of the control section 100. The CPU 115 is configured to run control programs stored in the ROM 112, and control an operation of the film formation apparatus 1, in accordance with a recipe (process recipe) stored in the recipe storage portion 111, following instructions from the operation panel 121. Specifically, the CPU 115 causes the (group of) temperature sensors 122, (group of) pressure gages 123, and MFC controllers 125 to measure temperatures, pressures, and flow rates at respective portions inside the reaction tube 2, exhaust line, and so forth. Further, the CPU 115 outputs control signals, based on measurement data, to the heater controller 124, MFC controllers 125, valve controllers 126, and vacuum pump 127, to control the respective portions mentioned above in accordance with a process recipe.

Figure 4:
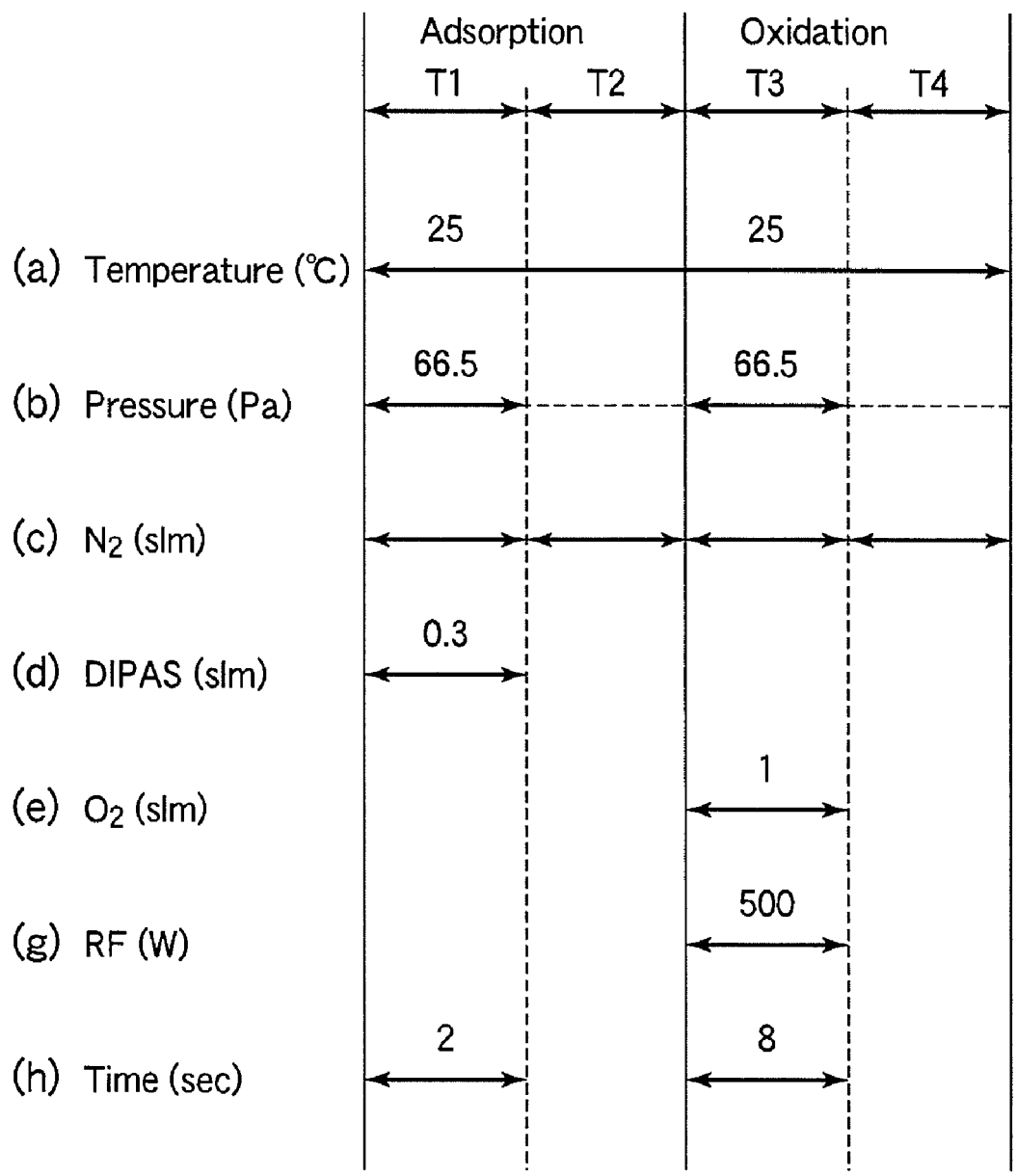
FIG. 4 is a timing chart showing the recipe of a film formation process according to the embodiment of the present invention.

Next, an explanation will be given of a film formation method (so called ALD or MLD film formation) performed under the control of the control section 100 in the apparatus shown in FIG. 1. In this film formation method, a silicon oxide film is formed on semiconductor (Si) wafers W by plasma CVD. In order to achieve this, a first process gas comprising DIPAS gas as a silicon source gas, and a second process gas comprising oxygen ($O_2$) gas as an oxidizing gas are selectively supplied to the process field 2a accommodating wafers W. FIG. 4 is a timing chart showing the recipe of a film formation process according to the embodiment of the present invention.

The respective components of the film formation apparatus 1 described below are operated under the control of the control section 100 (CPU 115). The temperature and pressure of the process field 2a and the gas flow rates during the processes are set in accordance with the recipe shown in FIG. 4, while the control section 100 (CPU 115) controls the heater controller 124 (for the heater 7), MFC controllers 125 (for the gas distribution nozzles 8 and 9 and gas nozzle 16), valve controllers 126, vacuum pump 127, and plasma controller 129 (plasma generation section 10), as described above.

At first, the wafer boat 6 at room temperature, which supports a number of, e.g., 50 to 100, wafers having a diameter of 300 mm, is loaded to the process field inside the reaction tube 2 set at a predetermined temperature, and the reaction tube 2 is airtightly closed. Then, the interior of the reaction tube 2 is vacuum-exhausted and kept at a predetermined process pressure. Then, while the wafer boat 6 is rotated, the first and second process gases are intermittently supplied from the respective gas distribution nozzles 9 and 8 at controlled flow rates.

In summary, at first, the first process gas comprising DIPAS gas is supplied from the gas spouting holes of the gas distribution nozzle 9 to form gas flows parallel with the wafers W on the wafer boat 6. While being supplied, molecules of the DIPAS gas and molecules and atoms of decomposition products generated by gas decomposition are adsorbed on the surface of the wafers W to form an adsorption layer (adsorption stage).

Then, the second process gas comprising $O_2$ gas is supplied from the gas spouting holes of the gas distribution nozzle 8 to form gas flows parallel with the wafers W on the wafer boat 6. The second process gas is selectively excited and partly turned into plasma when it passes through the plasma generation area between the pair of electrodes 11. At this time, oxygen radicals (activated species), such as $O^*$ and $O_2^*$, are produced. The radicals flow out from the opening 10b of the plasma generation section 10 toward the center of the reaction tube 2, and are supplied into gaps between the wafers W in a laminar flow state. When oxygen radicals are supplied onto the wafers W, they react with Si in the adsorption layer on the wafers W, and a thin film of silicon oxide is thereby formed on the wafers W (oxidation stage).

As shown in FIG. 4, the film formation method according to this embodiment is arranged to alternately repeat first to fourth steps T1 to T4 so as to alternately repeat the adsorption and oxidation stages. A cycle comprising the first to fourth steps T1 to T4 is repeated a number of times, such as 100 times, and thin films of silicon oxide formed by respective times are laminated, thereby arriving at a silicon oxide film having a target thickness.

Specifically, the first step T1 is arranged to perform supply of DIPA gas to the process field 2a, while maintaining a shut-off state of supply Of $O_2$ gas to the process field 2a. The second step T2 is arranged to maintain the shut-off state of supply of the DIPA gas and $O_2$ gas to the process field 2a. The third step T3 is arranged to perform supply of the $O_2$ gas to the process field 2a, while maintaining the shut-off state of supply of the DIPA gas to the process field 2a. Further, through the third step T3, the RF power supply 11a is set in an ON state to turn the $O_2$ gas into plasma by the plasma generation section 10, so as to supply the $O_2$ gas in an activated state to the process field 2a. The fourth step T4 is arranged to maintain the shut-off state of supply of the DIPA gas and $O_2$ gas to the process field 2a. $N_2$ gas used as a dilution or purge gas is kept supplied over the first to fourth steps T1 to T4.

Each of the second and fourth steps T2 and T4 is used as a purge step to remove the residual gas within the reaction tube 2. The term "purge" means removal of the residual gas within the reaction tube 2 by vacuum-exhausting the interior of the reaction tube 2 while supplying an inactive gas, such as $N_2$ gas, into the reaction tube 2, or by vacuum-exhausting the interior of the reaction tube 2 while maintaining the shut-off state of supply of all the gases. In this respect, the second and fourth steps T2 and T4 may be arranged such that the first half utilizes only vacuum-exhaust and the second half utilizes both vacuum-exhaust and inactive gas supply. Further, the first and third steps T1 and T3 may be arranged to stop vacuum-exhausting the reaction tube 2 while supplying each of the first and second process gases. However, where supplying each of the first and second process gases is performed along with vacuum-exhausting the reaction tube 2, the interior of the reaction tube 2 can be continuously vacuum-exhausted over the entirety of the first to fourth steps T1 to T4.

It should be noted that, in light of the film formation sequence, the temperature of the process field 2a is preferably set to be constant during the film formation. Accordingly, in this embodiment, the temperature of the process field 2a is preferably set at the same temperature, such as room temperature (e.g., 25° C.), over the adsorption and oxidation stages. Further, the process field 2a is preferably kept exhausted over the adsorption and oxidation stages.

More specifically, in the adsorption stage, at first, while nitrogen gas is supplied to the process field 2a at a predetermined flow rate, as shown in FIG. 4, (c), the process field 2a is set at a predetermined temperature, such as room temperature (e.g., 25° C.), as shown in FIG. 4, (a). In this case, since the process field 2a is set at room temperature, the heater 7 is not used to heat the process field 2a. Further, the reaction tube 2 is exhausted to set the process field 2a at a predetermined pressure, such as 66.5 Pa (0.5 Torr), as shown in FIG. 4, (b). Then, DIPAS gas is supplied to the process field 2a at a predetermined flow rate, such as 0.3 slm, as shown in FIG. 4, (d), and nitrogen gas is also supplied to the process field 2a at a predetermined flow rate, as shown in FIG. 4, (c) (T1: flow step).

After the flow step of the adsorption stage is performed for 1 to 3 seconds, such as 2 seconds, as shown in FIG. 4, (h), the supply of DIPAS gas is stopped. On the other hand, nitrogen gas is kept supplied from the gas distribution nozzle 9 to the process field 2a at a predetermined flow rate, as shown in FIG. 4, (c). Further, the reaction tube 2 is exhausted to exhaust gas from the process field 2a (T2: purge step).

In the oxidation stage subsequently performed, at first, while nitrogen gas is supplied to the process field 2a at a predetermined flow rate, as shown in FIG. 4, (c), the process field 2a is set at a predetermined temperature, such as room temperature (e.g., 25° C.), as shown in FIG. 4, (a). At this time, the reaction tube 2 is exhausted to set the process field 2a at a predetermined pressure, such as 66.5 Pa (0.5 Torr), as shown in FIG. 4, (b). Then, an RF power of 500 W is applied between the electrodes 11 (RF: ON), as shown in FIG. 4, (g). Further, oxygen gas is supplied to a position between the electrodes 11 (inside the plasma generation section 10) at a predetermined flow rate, such as 1 slm, as shown in FIG. 4, (e). The oxygen gas thus supplied is excited (activated) into plasma between the electrodes 11 and generates radicals containing oxygen atoms ($O^*$ and $O_2^*$). The radicals containing oxygen atoms thus generated are supplied from the plasma generation section 10 to the process field 2a. Further, nitrogen gas is also supplied from the gas distribution nozzle 9 to the process field 2a at a predetermined flow rate, as shown in FIG. 4, (c) (T3: flow step).

The radicals flow out from the opening 10b of the plasma generation section 10 toward the center of the reaction tube 2, and are supplied into gaps between the wafers W in a laminar flow state. When radicals containing oxygen atoms are supplied onto the wafers W, they react with Si in the adsorption layer on the wafers W, and a thin film of silicon oxide is thereby formed on the wafers W.

After the flow step of the oxidation stage is performed for 5 to 30 seconds, such as 8 seconds, as shown in FIG. 4, (h), the supply of oxygen gas is stopped and the application of RF power is stopped. On the other hand, nitrogen gas is kept supplied from the gas distribution nozzle 9 to the process field 2a at a predetermined flow rate, as shown in FIG. 4, (c). Further, the reaction tube 2 is exhausted to exhaust gas from the process field 2a (T4: purge step).

As described above, a cycle alternately comprising the adsorption and oxidation stages in this orders is repeated a predetermined number of times. In each cycle, DIPAS is supplied onto the wafers W to form an adsorption layer, and then radicals containing oxygen atoms are supplied to oxidize the adsorption layer, so as to form a silicon oxide film. As a result, a silicon oxide film of high quality can be formed with high efficiency.

When the silicon oxide film formed on the surface of the semiconductor wafers W reaches a predetermined thickness, the wafers W are unloaded. Specifically, nitrogen gas is supplied into the reaction tube 2 at a predetermined flow rate, so that the pressure inside the reaction tube 2 is returned to atmospheric pressure. Then, the lid 18 is moved down by the boat elevator 25, and the wafer boat 6 is thereby unloaded out of the reaction tube 2, along with the wafers W.

FIGS. 7A to 7F are views schematically showing a reaction on the surface of a Si wafer where DIPAS gas is used as a silicon source gas.

Figure 7A:
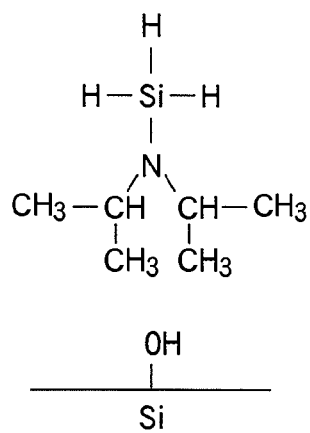
FIGS. 7A to 7F are views schematically showing a reaction on the surface of a Si wafer where di-iso-propylaminosilane gas is used as a silicon source gas.
Figure 7B:
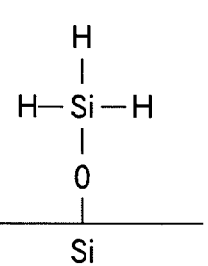
Figures 7C, 7D:
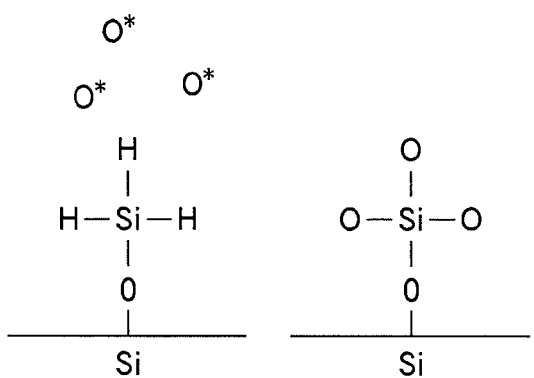
Figure 7E:
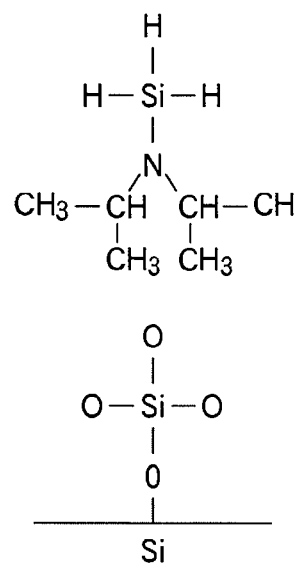
Figure 7F:
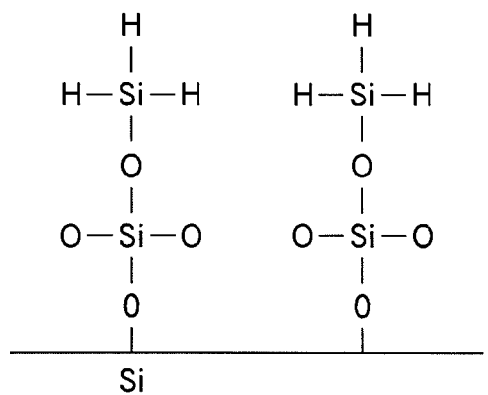

The DIPAS gas supplied to the process field 2a is heated and activated inside the process field 2a, and an adsorption layer containing silicon is formed on the surface of each semiconductor wafer W, as shown from FIG. 7A to FIG. 7B. In FIG. 7A, an OH group present on the surface of the Si wafer W is derived from, e.g., the surface of an $SiO_2$ film deposited thereon in advance. The adsorption layer is formed to contain no nitrogen (N), because $N(CH(CH_3)_2)_2$ is separated from silicon when the adsorption layer is formed. This $N(CH(CH_3)_2)_2$ is removed by the purge step.

Then, after the purge step, oxygen radicals are supplied to the process field 2a. Consequently, as shown from FIG. 7C to FIG. 7D, the adsorption layer on the wafer W is oxidized (H in the adsorption layer is replaced with O), whereby a silicon oxide film is formed on the wafer W. A cycle comprising the adsorption and oxidation described above is repeated a number of times, whereby silicon oxide films are laminated, as shown from FIG. 7E to FIG. 7F.

As described above, DIPAS used as a silicon source gas is a univalent aminosilane and makes nitrogen hardly contained in a silicon oxide film to be formed, whereby a silicon oxide film of high quality is obtained. Further, in this case, structural impediments, which impede molecule adsorption, can hardly occur when the adsorption layer is formed, and the adsorption rate is not decreased, whereby a high film formation rate is maintained. Further, DIPAS is thermally stable and facilitates its flow rate control such that conventional systems can be used for the source supply, resulting in high versatility.

During the film formation process, the temperature of the process field 2a is set to be −32° C. to 700° C. If the temperature of the process field 2a is lower than −32° C., supply of DIPAS used as a silicon source gas may be hindered. This is so, because, in consideration of a pressure loss caused by the process gas supply line, MFC, and so forth connected to the DIPAS gas source, the lower limit temperature for providing a practicable vapor pressure of DIPAS is −32° C. On the other hand, if the temperature of the process field 2a is higher than 700° C., the film quality and uniformity of film thickness of the formed silicon oxide film may be deteriorated.

This temperature is preferably set to be within a range of room temperature to 500° C., more preferably of room temperature to 400° C., and furthermore preferably of room temperature to 300° C. Such range makes it possible to well utilize the feature (effect) of forming a thin film at a lower temperature than ever before.

The flow rate of the DIPAS gas is preferably set to be 10 sccm to 10 slm. If the flow rate is lower than 10 sccm, the DIPAS supply onto the surface of the wafers W may become insufficient. If the flow rate is higher than 10 slm, the DIPAS ratio contributory to adsorption onto the surface of the wafers W may become too low. The flow rate of DIPAS gas is more preferably set to be 0.05 slm to 3 slm. This flow rate range makes it possible to promote the DIPAS reaction on the surface of the wafers W.

The pressure of the process field 2a (process pressure) in the DIPAS supply is preferably set to be 0.133 Pa (1 mTorr) to 13.3 kPa (100 Torr). This pressure range makes it possible to promote the DIPAS reaction on the surface of the wafers W.

The flow rate of the oxygen gas is preferably set to be 0.1 sccm to 10 slm. This flow rate range makes it possible to generate plasma without difficulty and to supply oxygen radicals sufficient to form a silicon oxide film. The flow rate of oxygen gas is more preferably set to be 0.5 slm to 5 slm. This pressure range makes it possible to stably generate plasma.

The RF power is preferably set to be 10 to 1,500 W. If the power is lower than 10 W, it is difficult to generate oxygen radicals. If the power is higher than 1.500 W, the quartz wall of the plasma generation section 10 may be damaged. The RF power is more preferably set to be 50 to 500 W. This power range makes it possible to efficiently generate radicals.

The pressure of the process field 2a (process pressure) in the oxygen supply is preferably set to be 0.133 Pa (1 mTorr) to 13.3 kPa (100 Torr). This pressure range makes it possible to easily generate oxygen radicals and to increase the mean free path of oxygen radicals in the process field 2a. This pressure is more preferably set to be 40 Pa (0.3 Torr) to 400 Pa (3 Torr). This pressure range makes it possible to easily control the pressure of the process field 2a.

The pressure inside the plasma generation section 10 (the pressure at the gas spouting holes) is preferably set to be 0.133 Pa (1 mTorr) to 13.3 kPa (100 Torr), and more preferably to be 70 Pa (0.53 Torr) to 400 Pa (3 Torr). This pressure range makes it possible to generate plasma without difficulty and to supply oxygen radicals sufficient to form a silicon oxide film.

<Experiment 1>

In order to find a preferable temperature of the process field 2a, a silicon oxide film was formed on semiconductor wafers W while the set temperature of the process field 2a was adjusted to different values. At this time, the cycle rate and inter-substrate uniformity of the film thickness were measured. The set temperature of the process field 2a was adjusted to room temperature (25° C.), 75° C., 100° C., 200° C., and 300° C.

Figure 5:
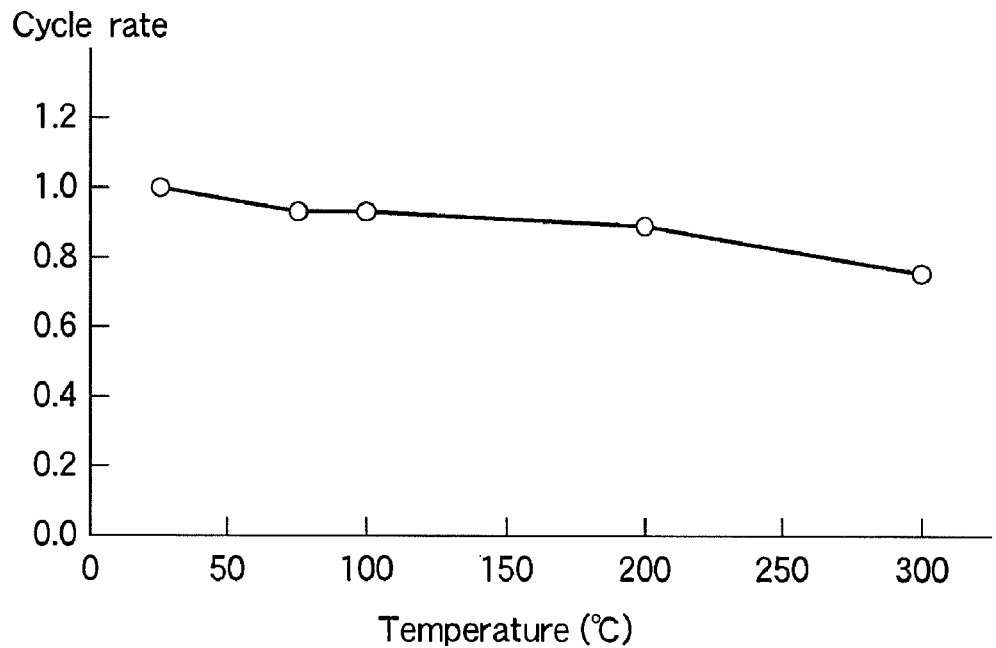
FIG. 5 is a graph showing the relationship of the cycle rate of a film thickness relative to the set temperature of a process field.
Figure 6:
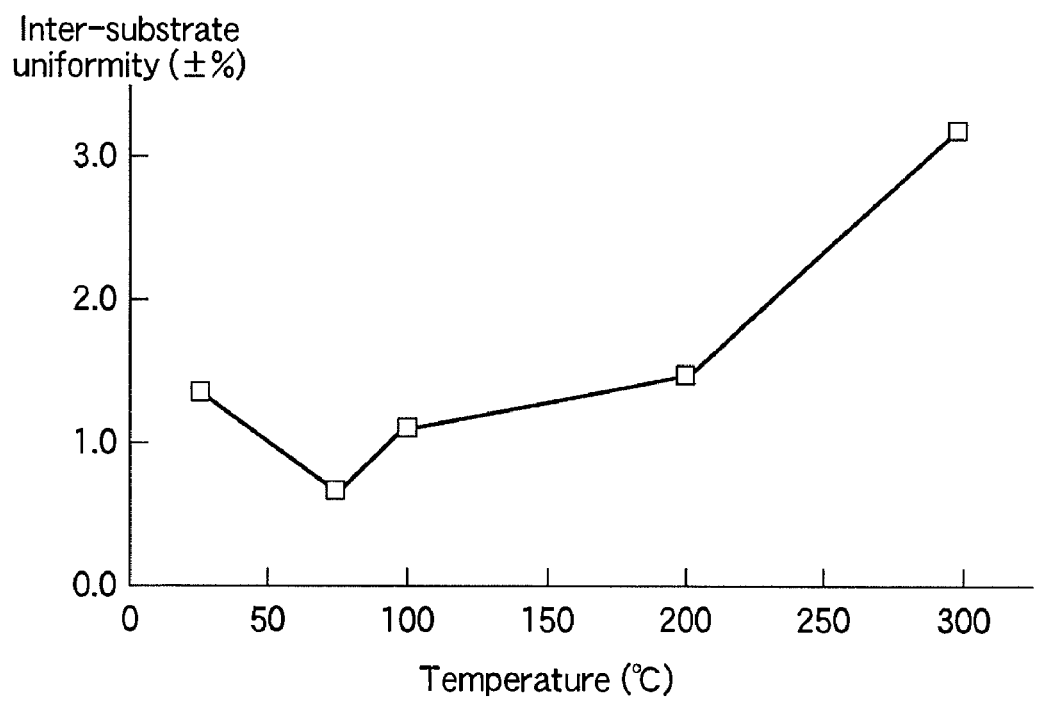
FIG. 6 is a graph showing the relationship of the inter-substrate uniformity of a film thickness relative to the set temperature of a process field.

FIG. 5 is a graph showing the relationship of the cycle rate of a film thickness relative to the set temperature of a process field. FIG. 6 is a graph showing the relationship of the inter-substrate uniformity (±%) of a film thickness relative to the set temperature of a process field. The cycle rate shown in FIG. 5 is a ratio in the film thickness obtained by one cycle (Å/cycle) at each set temperature of the process field relative to that obtained at 25° C. used as the set temperature (i.e., the film thickness obtained by one cycle at 25° C. was used as the reference value "1").

As shown in FIG. 6, where the set temperature of the process field was adjusted to a temperature within a range of room temperature (25° C.) to 200° C., the inter-substrate uniformity was remarkably improved. Specifically, where the set temperature was within this temperature range, the inter-substrate uniformity thereby obtained was ½ to ⅕ of the inter-substrate uniformity obtained where the set temperature of the process field was 300° C. Further, as shown in FIG. 5, where the set temperature of the process field was adjusted to a temperature within a range of room temperature (25° C.) to 200° C., the cycle rate was improved. Specifically, where the set temperature was within this temperature range, the cycle rate thereby obtained was 1.1 to 1.3 times the cycle rate obtained where the set temperature of the process field was 300° C. Accordingly, it has been found that the temperature of the process field is most preferably set to be within a range of room temperature to 200° C.

<Experiment 2>

A silicon oxide film was formed by the method according to the embodiment described above and was observed by an X-ray photoelectron spectrometer (XPS) to examine its composition. As a result, it was confirmed that the silicon oxide film contained no nitrogen. Further, a silicon oxide film was formed by this method and was observed by an atomic force microscope (AFM) to perform image analysis of its surface roughness. As a result, it was confirmed that the silicon oxide film had a good surface morphology. Accordingly, it has been found that a silicon oxide film of high quality can be formed at a lower temperature, such as room temperature, by the method described above.

<Experiment 3>

A silicon oxide film was formed by the method according to the embodiment described above and the film formation rate (deposition rate) per minute was measured and resulted in 1.5 nm/min. Further, it was confirmed that the adsorption rate was maintained and thus the productivity was not lowered even under room temperature. This was so, probably because DIPAS used as a silicon source gas hardly caused structural impediments and so adsorption of other molecules was less hindered, in the process of Si adsorption in the adsorption stage.

<Experiment 4>

A silicon oxide film was formed under room temperature by use of each of bivalent and trivalent aminosilane gases, such as BTBAS(SiH2(NHC(CH$_3$)$_3$)$_2$) and 3DMAS(SiH(N(CH$_3$)$_2$)$_3$), as a silicon source gas and the quality of the film thus formed was examined. As a result, a silicon oxide film of high quality was not formed under room temperature.

<Experiment 5>

A silicon oxide film was formed under room temperature by use of SiH$_3$(N(CH$_3$)$_2$), which was a univalent aminosilane, as a silicon source gas and the process of the film formation was examined. As a result, the SiH$_3$(N(CH$_3$)$_2$) was thermally unstable and was difficult to control its flow rate. Accordingly, it has been found that use of $SiH_3(N(CH_3)_2)$ as a silicon source gas is undesirable in batch type processing apparatuses of the kind shown in FIG. 1 and that DIPAS, which is thermally stable and facilitates its flow rate control, is preferably usable for the same purpose.

<Consequence and Modification>

As described above, according to the embodiment, a silicon oxide film is formed on semiconductor wafers W by repeating a plurality of times a cycle comprising an adsorption stage for adsorbing Si by use of DIPAS and an oxidation stage for oxidizing the adsorbed Si. Consequently, a silicon oxide film of high quality can be formed at a low temperature.

Since DIPAS is used as a silicon source gas, the adsorption rate is not decreased, whereby the productivity is maintained. Further, DIPAS is thermally stable and facilitates its flow rate control such that conventional systems can be used for the source supply, resulting in high versatility.

In the embodiment described above, the oxidizing gas is exemplified by oxygen. In this respect, another gas, such as ozone ($O_3$) or water vapor ($H_2O$), may be used to oxidize adsorbed Si on semiconductor wafers W. For example, where ozone is used as an oxidizing gas, process conditions are preferably arranged such that the temperature of the process field 2a is set to be −32° C. to 600° C., the pressure thereof is set at 655 Pa (5 Torr), and the flow rates of oxygen ($O_2$) and ozone are respectively set at 10 slm and about 250 g/Nm$^3$.

In the embodiment described above, the temperature of the process field 2a is set at the same temperature (room temperature) over the adsorption stage and oxidation stage. In this respect, the temperature of the process field 2a may be set at different temperatures between the adsorption stage and the oxidation stage. For example, the temperature of the process field 2a may be set at room temperature in the adsorption stage and set at 100° C. in the oxidation stage.

In the embodiment described above, oxygen radicals are generated by use of plasma. In this respect, another medium, such as catalyst, UV, heat, or magnetic force, may be used to activate the oxidizing gas. For example, ozone may be supplied from an ozone generator into the reaction tube 2, while being activated by heat inside the reaction tube 2 or heat applied inside a heating vessel outside the reaction tube 2.

In the embodiment described above, a silicon oxide film is formed on semiconductor wafers W by repeating 100 times the cycle described above. Alternatively, for example, the repetition times of the cycle may be set to be smaller, such as 50, or set to be larger, such as 200. In such case, the flow rates of DIPAS and oxygen gases, the RF power, and so forth are adjusted in accordance with the repetition times of the cycle to provide the silicon oxide film with a predetermined thickness.

In the embodiment described above, a silicon oxide film is formed on semiconductor wafers W. Alternatively, the present invention may be applied to a case where another silicon-containing insulating film, such as a silicon nitride film, is formed. In this case, for example, a silicon nitride film is formed on semiconductor wafers W by repeating a plurality of times a cycle comprising an adsorption stage for adsorbing Si by use of DIPAS and a nitridation stage for nitriding the adsorbed Si by use of a nitriding gas. The nitriding gas may be one or more gases selected from the group consisting of ammonia ($NH_3$), nitrogen dioxide ($N_2O$), nitrogen oxide (NO), and nitrogen ($N_2$).

In the embodiment described above, nitrogen gas may be supplied as a dilution gas when a process gas is supplied. In this respect, no nitrogen gas may be supplied when the process gas is supplied. However, the process gas preferably contains nitrogen gas as a dilution gas, because the process time can be more easily controlled if it is so arranged. The dilution gas consists preferably of an inactive gas, such as nitrogen gas or another inactive gas, e.g., helium (He), neon (Ne), argon (Ar), krypton (Kr), or xenon (Xe) in place of nitrogen gas.

In the embodiment described above, a silicon source gas and nitrogen gas are supplied through a common gas supply nozzle. Alternatively, gas supply nozzles may be respectively disposed in accordance with the types of gases. Further, a plurality of gas supply nozzles may be connected to the sidewall of the reaction tube 2 near the bottom, to supply each gas through a plurality of nozzles. In this case, a process gas is supplied through a plurality of gas supply nozzles into the reaction tube 2, and thereby more uniformly spreads in the reaction tube 2.

In the embodiment described above, the film formation apparatus employed is a heat processing apparatus of the batch type having a single-tube structure. However, for example, the present invention may be applied to a vertical heat processing apparatus of the batch type having a process container of the double-tube type, which is formed of inner and outer tubes. Alternatively, the present invention may be applied to a heat processing apparatus of the single-substrate type. The target substrate is not limited to a semiconductor wafer W, and it may be a glass substrate for, e.g., an LCD.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A film formation method for a semiconductor process for forming a silicon-containing insulating film on a target substrate by CVD, in a process field configured to be selectively supplied with a first process gas comprising di-iso-propylaminosilane gas and a second process gas comprising an oxidizing gas or nitiriding gas, the method being arranged to perform a cycle a plurality of times to laminate thin films formed by respective times, thereby forming the silicon-containing insulating film with a predetermined thickness, the cycle alternately comprising:

a first step of performing supply of the first process gas to the process field while maintaining a shut-off state of supply of the second process gas to the process field, thereby forming an adsorption layer containing silicon on a surface of the target substrate; and a second step of performing supply of the second process gas to the process field while maintaining a shut-off state of supply of the first process gas to the process field, thereby oxidizing or nitiriding the adsorption layer on the surface of the target substrate, the second step comprising an excitation period of supplying the second process gas to the process field while exciting the second process gas by an exciting mechanism.

2. The method according to claim 1, wherein the first step is arranged to set the process field at a temperature of −32° C. to 300° C.

3. The method according to claim 1, wherein the first step is arranged to set the process field at a temperature of room temperature to 200° C.

4. The method according to claim 1, wherein the first and second steps are arranged to set the process field at the same temperature.

5. The method according to claim 1, wherein the second process gas comprises an oxidizing gas selected from the group consisting of oxygen, ozone, and water vapor.

6. The method according to claim 1, wherein the second process gas comprises a nitriding gas selected from the group consisting of ammonia, nitrogen dioxide, nitrogen oxide, and nitrogen.

7. The method according to claim 5, wherein the second process gas comprises oxygen as an oxidizing gas, and the first and second steps are arranged to set the process field at the same temperature within a range of −32° C. to 200° C.

8. The method according to claim 1, wherein the first step is arranged to set the process field at a pressure of 0.133 Pa to 13.3 kPa.

9. The method according to claim 1, wherein the first step is arranged to supply the di-iso-propylaminosilane to the process field at a flow rate of 10 sccm to 10 slm.

10. The method according to claim 1, wherein the second step is arranged to set the process field at a pressure of 0.133 Pa to 13.3 kPa.

11. The method according to claim 1, wherein the second step is arranged to supply the oxidizing gas or nitriding gas to the process field at a flow rate of 1 sccm to 10 slm.

12. The method according to claim 1, wherein the exciting mechanism is configured to excite the second process gas by use of a medium selected from the group consisting of plasma, catalyst, UV, heat, and magnetic force.

13. The method according to claim 12, wherein the exciting mechanism comprises a plasma generation section, which forms part of a supply system of the second process gas and is attached to a reaction chamber that envelops the process field.

14. The method according to claim 1, wherein the cycle further comprises an intermediate step of exhausting gas from the process field while maintaining a shut-off state of supply of the first and second process gases to the process field after the second step.

15. The method according to claim 14, wherein the cycle further comprises an intermediate step of exhausting gas from the process field while maintaining a shut-off state of supply of the first and second process gases to the process field between the first and second steps.

16. The method according to claim 14, wherein the cycle is arranged to exhaust gas from the process field continuously through the cycle.

17. The method according to claim 16, wherein the intermediate step comprises a period of supplying an inactive gas to the process field.

18. The method according to claim 1, wherein the process field is configured to accommodate a plurality of target substrates at intervals in a vertical direction, and the target substrates are heated by a heater disposed around the process field.

* * * * *